United States Patent [19]

Hashimoto

[11] Patent Number: 4,575,743
[45] Date of Patent: Mar. 11, 1986

[54] DOUBLE LAYER ROM INTEGRATED CIRCUIT

[75] Inventor: Masami Hashimoto, Suwa, Japan

[73] Assignee: Kabushiki Kaisha Suwa Seikosha, Tokyo, Japan

[21] Appl. No.: 488,841

[22] Filed: Apr. 26, 1983

[30] Foreign Application Priority Data

Apr. 27, 1982 [JP] Japan ................... 57-70960

[51] Int. Cl.⁴ ............... H01L 29/04; H01L 29/78; G11C 11/40
[52] U.S. Cl. .................. 357/23.12; 357/59; 357/41; 357/46; 357/23.1; 357/45; 365/104; 365/94
[58] Field of Search ............ 357/59, 23 D, 23 R, 357/41, 45, 23.1, 23.12; 365/94, 103, 104, 105

[56] References Cited

U.S. PATENT DOCUMENTS

| | | | |
|---|---|---|---|
| 3,865,651 | 2/1975 | Arita | 357/23.12 |
| 4,041,522 | 8/1977 | Oguey et al. | 357/59 |
| 4,068,217 | 1/1978 | Arnett et al. | 357/41 |
| 4,180,826 | 12/1979 | Shappir | 357/59 |
| 4,184,085 | 1/1980 | Takahashi | 357/59 |
| 4,424,579 | 1/1984 | Roesner | 357/41 |
| 4,453,175 | 6/1984 | Ariizumi et al. | 357/41 |
| 4,494,135 | 1/1985 | Moussie | 357/45 |

Primary Examiner—William D. Larkins
Assistant Examiner—Charles S. Small, Jr.
Attorney, Agent, or Firm—Blum Kaplan Friedman Silberman & Beran

[57] ABSTRACT

A first ROM is comprised of a transistor matrix. The polycrystalline silicon forming the gates of the transistors of the first ROM and another polycrystalline silicon region are arranged in a matrix, and diodes are formed by PN junctions at the crossing points. Thus, a second ROM is comprised of a diode matrix. The two ROMS are formed in layers on one common plane and each ROM can retain different information, independently of each other.

11 Claims, 6 Drawing Figures

DOUBLE LAYER ROM INTEGRATED CIRCUIT

BACKGROUND OF THE INVENTION

This invention relates generally to a read-only memory (ROM) of the type used to store permanent data and more particularly, to a double layer ROM where storage capacity is substantially increased without increasing chip size. A read-only memory is commonly utilized in many integrated circuits as a principle component. Generally, a ROM utilized in an integrated circuit is constructed by arranging transistors or diodes in a matrix on one plane. As a result, the ROM occupies a rather large area in the integrated circuit. Because formation of plural elements in overlapping relationship one to another in an integrated circuit has not been commonplace or has been impossible, the rather large area that a ROM occupies cannot be shared with another component. Heretofore, there have been only two ways to increase the capacity of a ROM, that is, to increase the pattern area for the ROM and consequently the chip area, or to miniaturize elements and increase the number of transistors in a given chip area. However, increasing the chip area leads to deterioration of the device and high manufacturing cost. Miniaturization of elements is limited by the technical capability at the present time. Therefore, means to enhance efficiency in using the pattern area for a ROM so as to increase the storage capacity has been greatly desired.

What is needed, is an integrated circuit ROM which stores more data per unit of chip area than has been conventionally achieved.

SUMMARY OF THE INVENTION

Generally speaking, in accordance with the invention, a ROM especially suitable for high density storage capacity is provided. Two ROMS are formed on a single plane. The first ROM is comprised of a transistor matrix. The polycrystalline silicon forming the gates of the transistors of the first ROM and another polycrystalline silicon region are arranged in a matrix, and diodes are formed by PN junctions at the crossing points. Thus, the second ROM is comprised of a diode matrix. The two ROMS are formed, as stated in layers on one common plane and each ROM can retain different information, independently of each other. Therefore, the capacity of the overall ROM constructed in accordance with the invention is at least twice as great as a conventional ROM of equal physical area. What is more, a ROM constructed in accordance with the invention does not require any new or special techniques but can be realized with the present level of skills.

Accordingly, it is an object of this invention to provide an improved ROM which permits a reduction in chip area necessary for the ROM by providing two ROMS of different types in layers on the same chip surface.

Another object of this invention is to provide an improved ROM which has an increased capacity for data storage relative to a conventional chip of the same area.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 5b is a cross-sectional view of the ROM of FIG. 5a.

DESCRIPTION OF THE PREFERRED EMBODIMENTS

Figure 1:
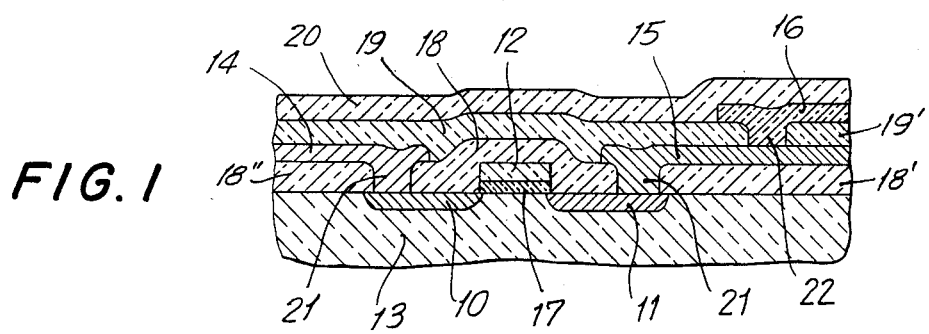
FIG. 1 is a cross-section of a portion of a MOS integrated circuit formed by a multi-layer wiring silicon gate process.

FIG. 1 is a cross-sectional view of a portion of an integrated circuit formed by a multi-layer wiring silicon gate process. The following description is for a construction where the transistor of FIG. 1 is a P-channel transistor comprising a source 10 and drain 11 which are formed of P-type diffusions. The gate 12 of the transistor is formed of a P-type polycrystalline silicon. Aluminum leads 14, 15 connect the transistors with a power source and provide for reading out signal data through contacting portions 21, 21' with the source 10 and drain 11 respectively. A multi-layer wire 16 of N-type or P-type polycrystalline silicon is electrically interconnected with the aluminum lead 15 through a contacting portion 22. The transistor is constructed on a N-type silicon substrate 13 and insulating layers 17, 18, 19 and 20 are of SiO2. The structure and elements necessary for this invention are all included in the conventional multi-layer interconnected transistor as described above.

A double layer ROM in accordance with the invention includes a first ROM which is formed of a matrix of transistors, and a second ROM which is formed of a matrix of P-type and N-type polycrystalline diodes. Transistors comprising the first ROM include a source and drain of P-type diffusion and a gate of P-type polycrystalline silicon which correspond to the elements designated with the reference numerals 10, 11, 12 in FIG. 1, respectively. Diodes comprising the second ROM are formed by PN junctions which appear when the P-type polycrystalline silicon 12 and N-type polycrystalline silicon 16 are in contact with each other in FIG. 1.

Figure 2:
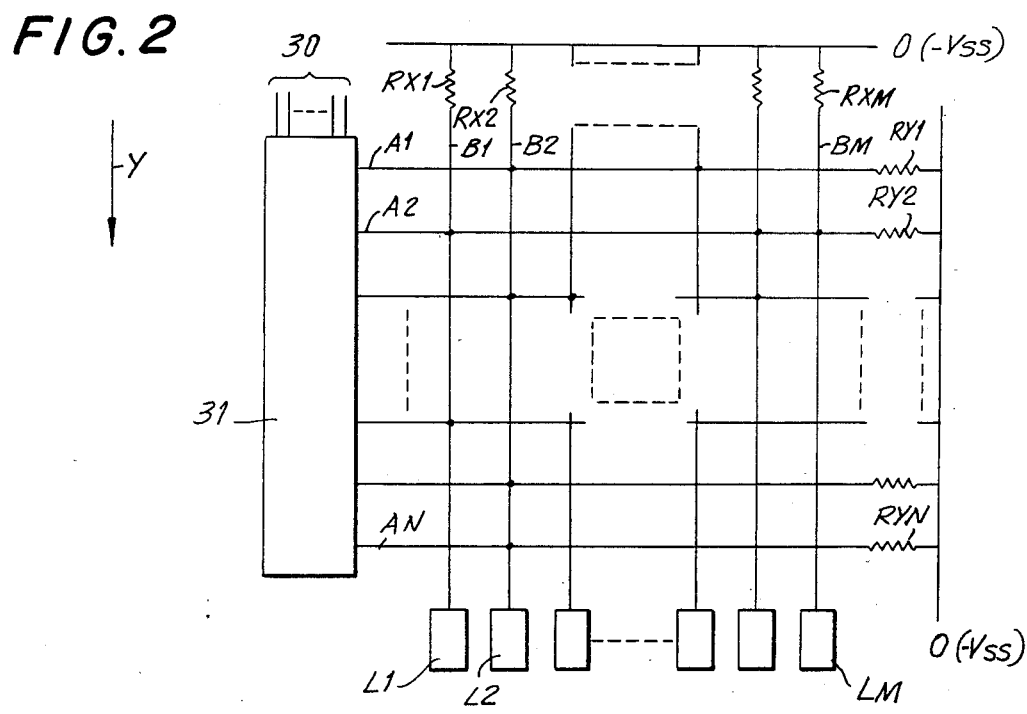
FIG. 2 is a functional block diagram of a read-only memory (ROM)

A ROM structure is now briefly described. FIG. 2 illustrates a ROM concept wherein signal lines, as many as M in the horizontal X direction, and as many as N in the vertical Y direction, are arranged in a matrix. In FIG. 2, black dots on the crossing of two signal lines means that there is an electrical connection between the two signal lines, however, the electrical connection does not necessarily mean a shorted condition. RX1, RX2, ... and RXM are load resistors connected in each signal line B1, B2 ... BM provided in the X direction, respectively. Similarly, RY1, RY2, ... RYN are load resistors connected in each signal line A1, A2, ... AN provided in the Y direction, respectively. Signals 30 provide address information for selecting a certain one of the signal lines A1 to AN and these signals 30 are inputted to an address decoder 31. Latch circuits L1, L2, ... LM store readout signals. The datum level at the coordinates X, Y is 1 where there is an electrical connection, or otherwise the level is 0.

If the Y-th signal line AY ($1 \leq Y \leq N$) is selected, data at every crossing of signal lines on the line AY is written into the corresponding latch circuit L1, L2 ... LM, respectively. Therefore, one can obtain the datum at the coordinates X, Y by reading out the contents of the X-th ($1 \leq X \leq M$) latch circuit LX.

Figure 3:
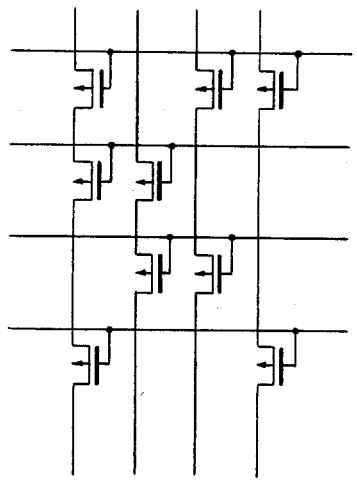
FIG. 3 is a circuit diagram of a ROM comprised of a transistor matrix.

FIG. 3 shows a ROM comprised of transistors wherein signal lines for the gates of the transistors and the sources and drains thereof form a matrix. The level 1 or 0 of datum at each crossing in the matrix is determined depending upon the presence of the transistor. If the ROM is formed of multi-layer interconnected silicon transistors as shown in FIG. 1, the presence or absence of transistors in FIG. 3 is equivalent to whether the silicon gate transistor is of the enhancement type with conventional threshold voltage or a strong depletion type transistor respectively.

Figure 4:
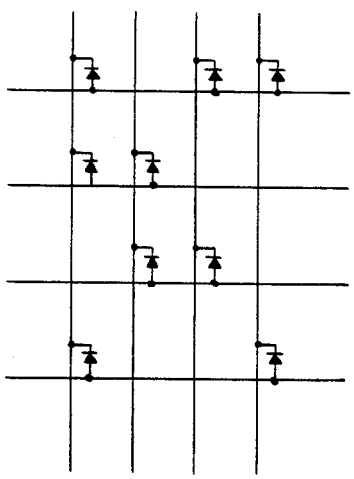
FIG. 4 is a circuit diagram of a ROM comprised of a diode matrix.

FIG. 4 shows a ROM composed of diodes wherein P-type polycrystalline silicon and N-type polycrystalline silicon regions are arranged in vertical and horizontal directions respectively to form a matrix. The presence of diodes at the crossing points in the matrix depends on the presence of PN junctions at the points. In view of FIG. 1, such PN junction is present when there is a contact hole at the crossing points of P-type polycrystalline silicon 12 and N-type polycrystalline silicon 16.

Figure 5A:
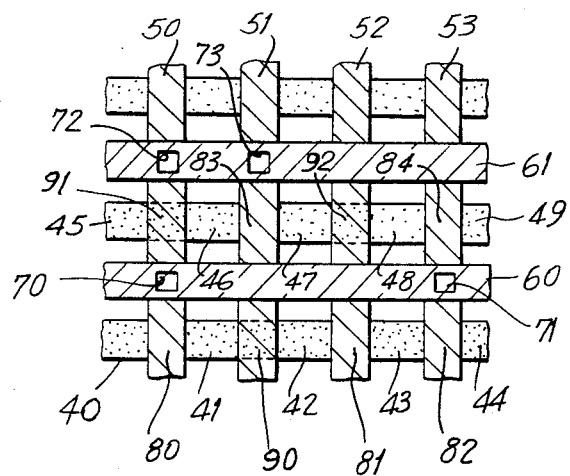
FIG. 5a is a plan view of a portion of a double layer ROM in accordance with the invention.
Figure 5B:
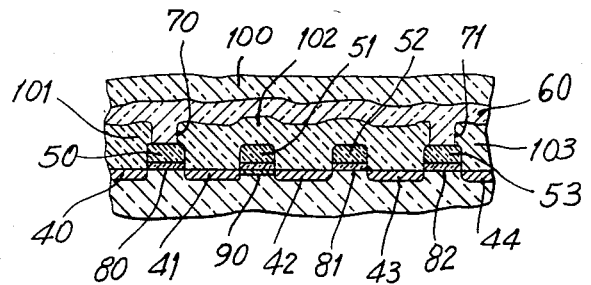

FIGS. 5a and 5b illustrate an embodiment of a double layer ROM integrated circuit in accordance with the invention which includes a first ROM formed of transistors in a matrix and a second ROM formed of diodes in a matrix of P-type and N-type polycrystalline silicon. FIG. 5 is a plan view and FIG. 5b is a cross-sectional view.

In FIGS. 5a, 5b, P-type diffusion regions 40–49 form the sources and the drains of transistors which are connected in series in the direction from 40 to 44 and from 45 to 49, and so on. P-type polycrystalline individual signal lines 50–53 also serve as the gate of each transistor. Enhancement type transistors 80–84 have the conventional threshold voltage and transistors 90–92 are strong depletion type transistors. Further, there are insulating layers 100–103 to complete the first ROM which is formed as a transistor matrix.

N-type polycrystalline silicon regions 60, 61 are arranged in a matrix or grid with the aforementioned P-type polycrystalline silicon signal lines 50–53. Contact holes 70–73 in the insulating layer permit formation of PN junctions between the N-type polycrys- talline 60, 61 and the P-type polycrystalline silicon 50–53 where diodes are formed by the PN junctions. Thus, a second ROM is formed of a diode matrix.

As described heretofore with reference to FIGS. 5a, and 5b, the first ROM of a transistor matrix and the second ROM of a diode matrix of P-type and N-type polycrystalline silicon are formed on one common plane in accordance with the invention. Moreover, because the first ROM and the second ROM can retain different information independently of each other, the capacity of the ROM as a whole necessarily increases as compared with a conventional single layer ROM of the same area.

In FIG. 5a, the P-type diffusions 40–44 and 45–49 and the N-type polycrystalline silicon 60, 61 are arranged alternately as illustrated in the Figure. This is done for clarity in illustration. However, in paractice, the N-type polycrystalline silicon 60, 61 can be positioned, for example, directly over the P-type diffusion regions 40–44.

Also, in accordance with the invention, the two different ROMs of the transistor matrix and diode matrix are not only formed on one common plane as illustrated in FIGS. 5a, b, but are also incorporated into one integrated circuit. Further, although the above description of FIGS. 1, 5a, 5b is based on an assumption that the transistors are P-channel transistors and the multi-layer wiring portion is N-type polycrystalline silicon, the reverse situation, that is, with the transistor as an N-channel transistor and the multi-layer wiring portion as P-type polycrystalline silicon, is equally satisfactory as a construction.

Furthermore, the embodiment described above is for a construction where the invention is applied to a multilayer wiring silicon gate process. However, this invention in alternative embodiments is also applied to other kinds of semi-conductor integrated circuitry in which the gate of the transistor and the multi-layer wiring portions are formed of other combinations of semi-conductor materials which permit the construction of PN junctions.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A double layer ROM integrated circuit comprising: a first ROM formed of a matrix of transistors, the source, drain and gate electrodes of the transistors being formed of one of P-type and N-type polycrystalline silicon; and a second ROM formed of a matrix of diodes, the diodes being formed by a junction between P-type and N-type polycrystalline silicon regions, the gate electrodes of the transistors in the first ROM being one of the polycrystalline silicon regions forming each of the diodes in the second ROM.

2. The double layer ROM of claim 1 wherein the first ROM is formed of P-channel transistors, the gate electrodes being formed of P-type polycrystalline silicon.

3. The double layer ROM of claim 2 wherein the diodes of the second ROM are formed by the junctions between the P-type polycrystalline silicon gates of the first ROM transistors and N-type polycrystalline silicon regions.

4. The double layer ROM of claim 1 wherein the diode matrix forming the second ROM is formed on top of the transistors forming the first ROM.

5. The double layer ROM of claim 1 wherein each of the diodes forming the second ROM is formed on the gate of one of the transistors forming the first ROM.

6. The double layer ROM of claim 2 wherein the diode matrix forming the second ROM is formed on top of the transistors forming the first ROM.

7. The double layer ROM of claim 3 wherein the diode matrix forming the second ROM is formed on top of the transistors forming the first ROM.

8. The double layer ROM of claim 2 wherein each of the diodes forming the second ROM is formed on the gate of one of the transistors forming the first ROM.

9. The double layer ROM of claim 3 wherein each of the diodes forming the second ROM is formed on the gate of one of the transistors forming the first ROM.

10. The double layer ROM of claim 1 wherein the first ROM is formed of N-channel transistors, the gate electrodes being formed of N-type polycrystalline silicon.

11. The double layer ROM of claim 1 wherein the first ROM is formed of P-channel transistors, the gate electrodes being formed of N-type polycrystalline silicon.

* * * * *